(12) United States Patent
Sonoda et al.

(10) Patent No.: US 7,402,513 B2
(45) Date of Patent: Jul. 22, 2008

(54) METHOD FOR FORMING INTERLAYER INSULATION FILM

(75) Inventors: Takanori Sonoda, Fukuyama (JP); Kazumasa Mitsumune, Kurashiki (JP); Kenichiroh Abe, Fukuyama (JP); Yushi Inoue, Fukuyama (JP); Tsukasa Doi, Fukuyama (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 256 days.

(21) Appl. No.: 11/034,616

(22) Filed: Jan. 12, 2005

(65) Prior Publication Data

US 2005/0159015 A1 Jul. 21, 2005

(30) Foreign Application Priority Data

Jan. 16, 2004 (JP) .............................. 2004-009401

(51) Int. Cl.
*H01L 21/461* (2006.01)
*H01L 21/4763* (2006.01)
*H01L 21/469* (2006.01)

(52) U.S. Cl. ........................ 438/622; 438/623; 438/624; 438/625; 438/724; 438/744; 438/757; 438/791; 257/758; 257/759; 257/760

(58) Field of Classification Search ........................ None
See application file for complete search history.

(56) References Cited

U.S. PATENT DOCUMENTS 5,403,780 A * 4/1995 Jain et al. .................... 438/624
6,333,547 B1 * 12/2001 Tanaka et al. ............... 257/649

(Continued)

FOREIGN PATENT DOCUMENTS

JP 04-133354 * 7/1992

(Continued)

OTHER PUBLICATIONS

Jonak-Auer, I. et al. (1997). "Determined of the Hydrogen Concentration of Silicon Nitride Layers by Fourier Transform Infrared Spectroscopy," *Infrared Physics & Technology* 38:223-226.

*Primary Examiner*—Carl Whitehead, Jr.
*Assistant Examiner*—James M Mitchell
(74) *Attorney, Agent, or Firm*—Morrison & Foerster LLP

(57) ABSTRACT

It is an object of the present invention to provide a method for forming an interlayer insulation film suppressing the occurrence of voids in the interlayer insulation film.

A method for forming an interlayer insulation film of the present invention, comprising the steps of: (1) forming an etching stopper film of a silicon nitride film on an entire surface including a step part on a semiconductor substrate having the step part with an aspect ratio of $\geq 3$; (2) forming an interlayer insulation film of an impurity-doped silicate film on the silicon nitride film; and (3) performing reflow of the interlayer insulation film by a heat treatment, wherein the formation of the silicon nitride film is controlled such that the N—H bond density of the silicon nitride film is $1.0 \times 10^{22}$ pieces/cm$^3$ or less.

According to the method for forming the interlayer insulation film of the present invention, the occurrence of the voids can be suppressed in the interlayer insulation film even if the aspect ratio of the step part formed on the semiconductor substrate is 3 or more. Also, the damage applied to the semiconductor device by reflow can be reduced.

2 Claims, 3 Drawing Sheets

U.S. PATENT DOCUMENTS

| | | | |
|---|---|---|---|
| 2002/0098688 A1* | 7/2002 | Suzuki et al. | 438/651 |
| 2002/0110982 A1* | 8/2002 | Watatani | 438/256 |
| 2003/0168676 A1* | 9/2003 | Itabashi et al. | 257/202 |

FOREIGN PATENT DOCUMENTS

| | | |
|---|---|---|
| JP | 06-283506 A | 10/1994 |
| JP | 2001-338976 A | 12/2001 |
| JP | 2001-345322 | 12/2004 |
| KR | 1020000027388 A | 5/2000 |

* cited by examiner

METHOD FOR FORMING INTERLAYER INSULATION FILM

CROSS-REFERENCE TO RELATED APPLICATION

This application is related to Japanese application No.2004-009401 filed on Jan. 16, 2004 whose priority is claimed under 35 USC §119, the disclosure of which is incorporated by reference in its entirety.

BACKGROUND OF THE INVENTION

1. Field of the Invention

The invention relates to a method for forming an interlayer insulation film.

2. Description of Related Art

A technique in which a step part of a high aspect ratio is embedded and flattened by an interlayer insulation film formed at low temperature has increasingly been raised in importance along with enhancement of density and integration of LSI.

FIG. 3 is a process sectional view showing a conventional method for manufacturing a semiconductor device. Hereinafter, a method for manufacturing a conventional semiconductor device will be described by using FIG. 3.

First, a gate insulating film 53a and a polysilicon film 53b are deposited on a semiconductor substrate 51, and a gate pattern 53 is formed by patterning. Next, sidewalls 55 are formed on the side surfaces of the gate pattern 53, and a structure shown in FIG. 3(a) is obtained. At this time, step parts 56 are formed between the gate patterns 53.

Next, source/drain regions 57 are formed by performing impurity ion implantation in a self-aligning manner to the sidewalls 55. a silicon nitride film (SiN film) 59 used as a stopper film when contact openings are formed is formed thereon, obtaining a structure shown in FIG. 3(b).

Next, for instance, an interlayer insulation film 61 composed by a BPSG film is deposited at about 400 to about 500° C. by a $SiH_4$—$O_2$-base atmospheric pressure CVD method or a TEOS-$O_3$-base CVD method, obtaining a structure shown in FIG. 3(c).

When the BPSG film 61 is deposited by the CVD method, the coverage of the BPSG film 61 is inferior in the step part 56 between the gates or the like, and the BPSG film 61 is formed in an overhanging shape. Thereby, voids 65 may be produced.

FIG. 4 is a plan view of the semiconductor substrate 51 on which elements are formed. Problems when voids 65 are produced will be described by using FIG. 4.

After the processes above, tungsten plugs 67 are usually formed arranged in parallel in the longitudinal direction of the gate pattern 53 in the step parts 56 between the gate patterns 53. Since the voids 65 are also formed in parallel in the longitudinal direction of the gate pattern 53, a problem occurs in that when the tungsten plugs 67 are formed by a CVD method or the like, tungsten enters into inside of the voids 65 and the adjacent tungsten plugs 67 are electrically connected.

The voids 65 are usually quenched by performing reflow of the BPSG film 61 by a heat treatment in a furnace of about 850° C. or lamp annealing of about 1000° C.

However, along with further miniaturization of a device, when the interlayer insulation film 61 is formed by embedding the above-mentioned BPSG film in a region between gates having a step part of a narrower pitch interval (for instance, the pitch being narrower than a gate space of 0.3 μm: the space being 0.2 μm or less after forming the sidewalls) and a high aspect ratio (for instance, an aspect ratio above 3), the coverage immediately after the film formation becomes worse, and voids 65 caused after the film formation become larger. A heat treatment in a furnace of at least 850° C. for about 15 minutes or a lamp annealing at 1000° C. for about 30 seconds is required as a reflow processing after the film formation so as to quench the voids 65. However, a demand for lowering a process temperature becomes more severe along with miniaturization of a device. When a heat treatment of 800° C. or higher is performed in a device of 0.18 μm or less, a problem occurs in that transistor characteristics such as suppression of short channel effect and driving current cannot be sufficiently secured. Therefore, a high temperature annealing condition cannot be used.

A method for forming a BPSG film by a twice divided process is disclosed as a conventional method for solving such a problem (for instance, refer to Japanese Unexamined Patent Publication No. 2001-345322). In this method, first, a first BPSG film is formed, and unevenness of the surface is then improved by applying a first heat treatment. Next, a second BPSG film is formed, and a second heat treatment is then applied.

However, when the BPSG film is formed by a twice divided process, an interface between an upper BPSG film and a lower BPSG film is exposed in a contact forming process or an interlayer CMP process which is a subsequent process, and an abnormal shape may be produced from an etch speed difference of a wet processing due to a difference between characteristics of the upper BPSG film and that of the lower BPSG film.

Also, a method for performing a reflow processing at low temperature by improving impurity concentration of the BPSG film is known.

When the impurity concentration of the BPSG film is improved, a temperature of a reflow processing can be lowered. However, since shrink fastening is insufficient, the film is not compact and becomes unstable.

Thus, it is difficult to form an excellent interlayer insulation film in which voids do not remain without damaging reliability of a device.

SUMMARY OF THE INVENTION

The present invention has been accomplished in view of the foregoing. It is an object of the present invention to provide a method for forming an interlayer insulation film suppressing the occurrence of voids in the interlayer insulation film.

A method for forming an interlayer insulation film of the present invention, comprises the steps of: (1) forming an etching stopper film of a silicon nitride film on an entire surface including a step part on a semiconductor substrate having the step part with an aspect ratio of $\geq 3$; (2) forming an interlayer insulation film of an impurity-doped silicate film on the silicon nitride film; and (3) performing reflow of the interlayer insulation film by a heat treatment, wherein the formation of the silicon nitride film is controlled such that the N—H bond density of the silicon nitride film is $1.0 \times 10^{22}$ pieces/cm$^3$ or less.

The present inventors have found that when the N—H bond density of the silicon nitride film is made smaller, the occurrence of voids is suppressed in the interlayer insulation film formed on the silicon nitride film. In addition, the present inventors have found that when the N—H bond density is $1.0 \times 10^{22}$ pieces/cm$^3$ or less, the occurrence of voids is suppressed in the interlayer insulation film even if the aspect ratio of the step part existing on the substrate is 3 or more, and then they have accomplished the present invention.

According to the method for forming the interlayer insulation film of the present invention, even if the aspect ratio of the step part existing on the semiconductor substrate is 3 or more, the occurrence of voids is suppressed in the interlayer insulation film.

Also, according to the method for forming the interlayer insulation film of the present invention, it is possible to perform a heat treatment for reflow at a low temperature and/or in a short period of time, and damage applied to a semiconductor device can be reduced.

DESCRIPTION OF THE PREFERRED EMBODIMENTS

Figure 1:
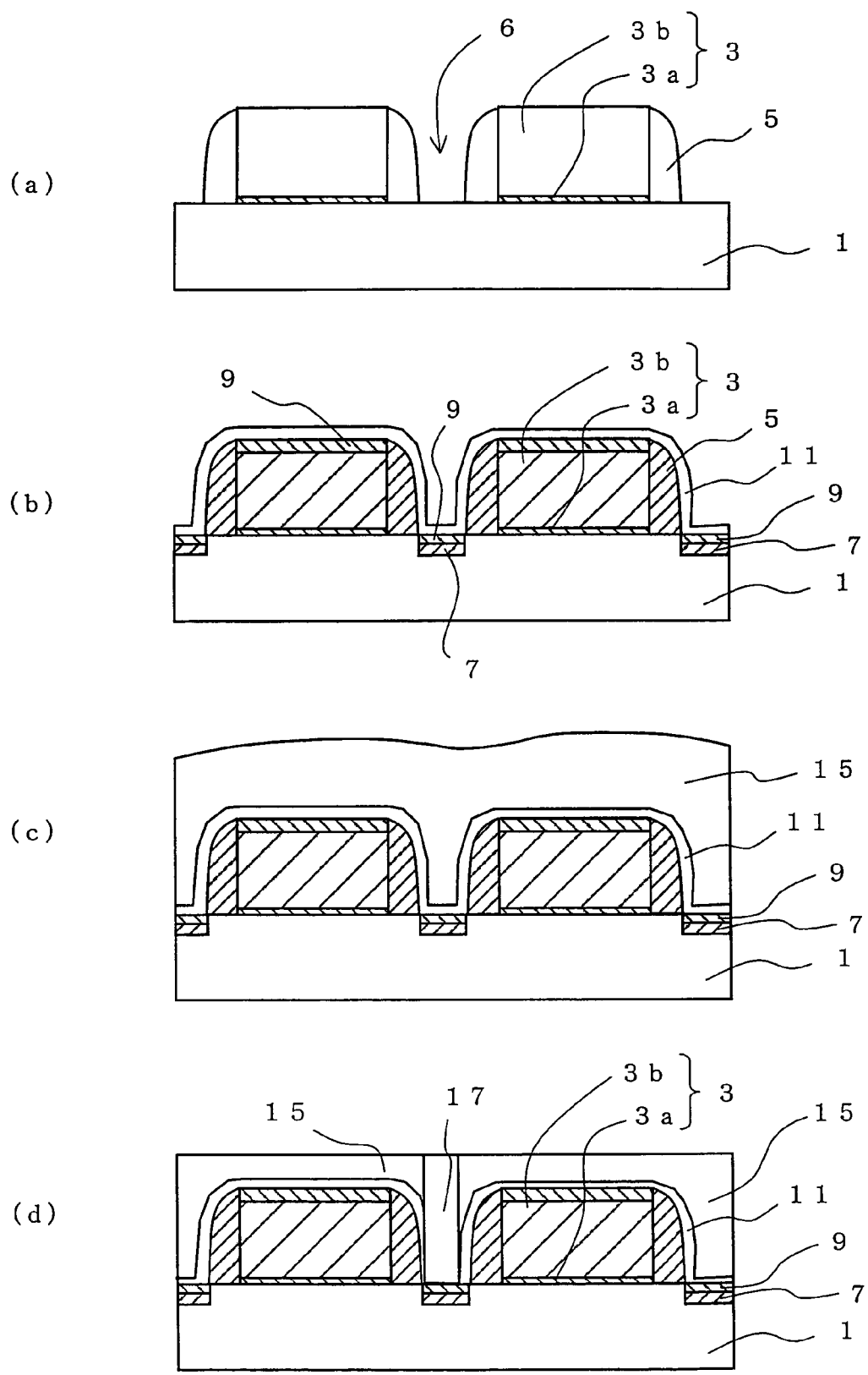
FIG. 1 is a sectional view showing a method for forming an interlayer insulation film according to Example 1 of the present invention.

A method for forming an interlayer insulation film of the present invention, comprises the steps of: (1) forming an etching stopper film of a silicon nitride film on an entire surface including a step part on a semiconductor substrate having the step part with an aspect ratio of $\geqq 3$; (2) forming an interlayer insulation film of an impurity-doped silicate film on the silicon nitride film; and (3) performing reflow of the interlayer insulation film by a heat treatment, wherein the formation of the silicon nitride film is controlled such that the N—H bond density of the silicon nitride film is $1.0 \times 10^{22}$ pieces/cm$^3$ or less.

First, the step (1), that is, the step for forming an etching stopper film of a silicon nitride film on an entire surface including a step part on a semiconductor substrate having the step part with an aspect ratio of $\geqq 3$ will be described.

In this specification, the term "on a semiconductor substrate" includes "contact with a semiconductor substrate," "contact with a semiconductor substrate through a protection film and an insulating film or the like," or "noncontact with a semiconductor substrate above the semiconductor substrate." Also, "on the other film" and "on the layer" or the like are the same.

For example, element semiconductor substrates such as Si and Ge, and compound semiconductor substrates such as GaAs can be used for the semiconductor substrate. These may be a monocrystal or a polycrystal.

The term "step part," that is, a recessed part means an area between two adjoining patterns, for example, an area formed between two adjoining gate patterns extending in parallel. The step part is made deeper by increasing the height of the gate pattern from the substrate, and the deeper the depth of the step part is, the more easily voids occur. Thereby, for example, the present invention is preferably used for manufacturing a nonvolatile semiconductor memory device having a two stage gate electrode and having a deep step part.

Though the present invention is preferably used when a semiconductor substrate has a step part with an aspect ratio of $\geqq 3$, the present invention can be applied even when a semiconductor substrate has a step part with an aspect ratio of <3.

The term "on an entire surface including a step part" means "on an area of the substrate covering at least the step part," and the case that the silicon nitride film is not formed on some part of the substrate is also included within a range of the present invention.

The film thickness of the silicon nitride film is usually thinner than that of an interlayer insulation film formed thereon. For example, the film thickness of the silicon nitride film is within a range of 10 to 50 nm, and preferably about 30 nm. The silicon nitride film may be formed by a low pressure thermal CVD method or a plasma CVD method or the like at a temperature of 450° C. to 700° C., and preferably 550 to 600° C. The reason is that because Co or Ni salicide is formed on a Si substrate, fluctuation in device (salicide) characteristics is produced when the film is formed at a temperature as high as 600° C. or higher.

When the silicon nitride film is formed, conditions such as rate, pressure and temperature of gases used are adjusted such that the N—H bond density of the silicon nitride film is $1.0 \times 10^{22}$ pieces/cm$^3$ or less. The conditions are changed according to a device or the like to be used. For example, the following conditions can be set in a low pressure thermal CVD device; use gas: SiH$_4$/NH$_3$=20/2000 sccm; temperature: 700° C.; pressure: 275 Torr. The N—H bond density is determined by the FT-IR method (for example, measured by the FTS-40 model manufactured by Bio-Rad Company). First, conditions that make the N—H bond density a desired value are determined by iteration of forming a silicon nitride film and measuring the N—H bond density thereof. Once the conditions are determined, the silicon nitride film whose N—H bond density is the desired value can be stably formed by following the conditions. The silicon nitride film functions as an etching stopper film in either of the following steps, for example, a step for forming contact holes in the interlayer insulation film and the like.

A step for modifying the surface of the silicon nitride film after the step (1) may be further provided.

The term "modifying the surface of the silicon nitride film" includes "oxidizing the surface of the silicon nitride film," "forming minute irregularities in the surface of the silicon nitride film," and "making the surface of the silicon nitride film a chemically active state." Though the occurrence of voids can be suppressed in the interlayer insulation film by controlling the N—H bond density of the silicon nitride film to a prescribed value or below in the step (1), the occurrence of voids can be further suppressed in the interlayer insulation film by modifying the surface of the silicon nitride film after the step (1).

For example, examples of the methods include the following three kinds.

A first method oxidizes the surface of the silicon nitride film in an O$_2$ atmosphere. At this time, the temperature may be within a range of 650 to 790° C., and more preferably about 700° C. The flow rate of O$_2$ gas may be within a range of 5 to 20 L/minute, and more preferably 5 to 15 L/minute. The oxidizing time may be within a range of 5 to 60 minutes, and more preferably 15 to 30 minutes. a process at low temperature cannot achieve the effect sufficiently for modifying the surface, and a process at a temperature as high as 800° C. or higher causes fluctuation in the device characteristics.

A second method oxidizes the surface of the silicon nitride film by a plasma processing in the O$_2$ or an N$_2$O atmosphere. O$_2$ and N$_2$O may be individually used or a mixed gas thereof may be used. At this time, the flow rate may be within a range of 500 to 5000 sccm, and preferably about 1500 sccm. At this time, the output may be within a range of 500 to 3000 W, and preferably about 1500 W. At this time, the pressure may be within a range of 0.1 to 1000 mTorr, and preferably about 800 mTorr. At this time, the temperature may be within a range of 300 to 550° C., and preferably 400 to 450° C.

A third method oxidizes the surface of the silicon nitride film by a liquid chemical processing. For example, a liquid mixture composed of sulfuric acid and hydrogen peroxide water, and ozone water or the like can be used for the liquid chemical.

The temperature at the time of a processing by the liquid mixture composed of the sulfuric acid and the hydrogen peroxide water may be within a range of 100 to 150° C., and preferably 120 to 150° C. The processing time may be within a range of 5 to 60 minutes, and preferably 5 to 20 minutes. In the case of the processing by ozone water, the processing at room temperature is preferable.

These methods may be used individually or in combination. For example, after the plasma processing is performed, the liquid chemical processing can be performed. The surface of the insulating film can be modified by either method so that an oxidizing atmosphere or the like is formed on the surface, and the interlayer insulation film can be stably formed on the insulating film.

Next, the process (2), that is, the step for forming an interlayer insulation film of an impurity-doped silicate film on the silicon nitride film will be described.

The term "impurity" is boron or phosphorus or the like, and the term "impurity-doped silicate film" is a BPSG film, a BSG film or a PSG film or the like.

The BPSG film may be formed by a known CVD method such as a TEOS-$O_3$-base CVD method. The thickness of the BPSG film may be within a range of 500 to 1500 nm, and more preferably 700 to 1200 nm.

The BPSG film may have a concentration of boron of 3.5 to 7.0 wt %, and more preferably about 4.0 to 6.0 wt %. The concentration of phosphorus in the BPSG film may be within a range of 3.5 to 6.0 wt %, and the total concentration of the impurity is preferably within a range of about 8.0 to 10.0 wt %. The reason is that an increase of boron concentration causes an increase in hygroscopicity of the film and an incompact film quality. This can cause deposition of impurities and poor quality of the film, and therefore post processes cannot be suitably performed. A growth temperature may be within a range of 350 to 600° C., and more preferably about 400 to about 500° C.

Next, the step (3), that is, the step for performing reflow of the interlayer insulation film by a heat treatment will be described.

When voids are produced, the voids can be quenched by performing reflow of the interlayer insulation film. A seam formed at the vicinity of the center of the step part can be bonded by performing reflow. According to the method of the present invention, even if voids are generated, the size of the voids is smaller than that of voids that occur by a conventional method, and thereby, the voids can be quenched by performing reflow at a comparatively low temperature in a short period of time.

The heat treatment is conducted in a furnace under an $N_2$ atmosphere at a temperature condition of 700° C. to 770° C., and preferably 750° C. to 770° C., or under a water vapor atmosphere at a temperature condition of 700° C. to 770° C., and preferably 700° C. to 750° C. The reason is that densification of the BPSG film is insufficient when the temperature condition is not higher than 700° C., and semiconductor elements are not easily damaged by reflow at a temperature of 770° C. or lower, though heat tolerance of semiconductor elements are lowered as the semiconductor elements are made minute.

The step for performing reflow of the interlayer insulation film by a heat treatment can be optional. The present invention provides not only a method for forming an interlayer insulation film but also a method for manufacturing a semiconductor device provided with the steps above.

EXAMPLE 1

FIG. 1 is a sectional view showing a method for forming an interlayer insulation film according to Example 1 of the present invention. Hereinafter, the method for forming the interlayer insulation film according to the present Example will be described with reference to FIG. 1.

First, a polysilicon film 3b is formed through a gate insulating film 3a on a semiconductor substrate 1, and the polysilicon film 3b is then patterned to form a gate pattern 3. Next, a silicon oxide film or a silicon nitride film is formed on the entire surface of the substrate 1 so as to cover the gate pattern 3, and is etched back and removed using dry etching. Sidewalls 5 are then formed at the sidewalls of the gate pattern 3 by the residual silicon oxide film or silicon nitride film, obtaining a structure shown in FIG. 1(a). At this time, the step parts 6 are formed between the gate patterns 3.

Next, source/drain regions 7 are formed in a self-alignment manner using the gate patterns 3 and the sidewalls 5 as a mask by a known method, and a cobalt salicide (CoSi) film 9 is selectively formed on the surface of the region 7 and gate pattern 3 in a self-alignment manner by a known method. The salicide is not limited to the cobalt-salicide, and the salicide film may be formed by using either metal with high melting point such as Ti, Ta or Mo having good affinity for Si.

Next, a silicon nitride film 11 having a film thickness of 50 nm is formed on the entire surface under the following conditions by a low pressure thermal CVD method, obtaining a structure shown in FIG. 1(b). The film 11 is used as a stopper film in a process for forming contact openings, which is a post process. The film formation conditions are adjusted such that the N—H bond density of the silicon nitride film 11 becomes $1.0 \times 10^{22}$ pieces/cm$^3$ or less. The conditions that make the N—H bond density such a value may be different in each CVD device. However, exemplary conditions are shown below. When the N—H bond density of the silicon nitride film formed in the following conditions does not become the desired value, the conditions that make the N—H bond density the desired value are determined by iteration of forming a silicon nitride film and measuring the N—H bond density thereof. Once the conditions are determined, the silicon nitride film whose N—H bond density is the desired value can be stably formed by following the conditions.

Temperature/pressure/: 700° C./275 Torr
Use gas: $SiH_4/NH_3$=20/2000 sccm
Film formation speed: 15 nm/minute
Film thickness: 50 nm For example, the silicon nitride film 11 may be formed in the following conditions by using a plasma CVD device. The case that the N—H bond density of the silicon nitride film formed in the following conditions does not become the desired value has been described above.

Temperature/pressure/: 550° C./4.2 Torr
Use gas: $SiH_4/NH_3/N_2$=200/80/4000 sccm
RF Power: 930 W
Film formation speed: 100 nm/minute
Film thickness: 50 nm Next, a BPSG film 15 having a thickness of 900 to 1200 nm is formed in the step parts 6 having a depth of 200 to 350 nm formed between the gate patterns 3. In this growth conditions, TEOS/TEP/TEOB is set to 600/195/47 mgm, and $O_3$/He is set to 4000/6000 sccm. The growth pressure is set to 200 Torr and, the growth temperature is set to 480° C. In addition, the concentration of boron (B) is set to 4.0 wt %, and the concentration of phosphorus (P) is set to 5.0 wt %. The growth speed is 350 nm/minute in the conditions.

Voids do not occur in the BPSG film 15 thus formed, or the size of voids is smaller than that of voids formed according to a conventional method even if voids are formed. The formed voids are quenched by a reflow heating treatment in an $N_2$ atmosphere at 770° C. for 30 minutes by using a heating furnace, and thereby a structure shown in FIG. 1(*c*) is obtained.

The BPSG film 15 may be previously annealed in a water vapor atmosphere at 700° C., and in this case, a reflow processing of the BPSG film 15 can be performed at lower temperature.

The BPSG film 15 is then flattened using a CMP method, and contact openings are formed in the step parts 6 between the gate patterns 3. Tungsten plugs 17 are then formed by embedding tungsten in the openings by a CVD method, and thereby a structure shown in FIG. 1(*d*) is obtained.

EXAMPLE 2

Figure 2:
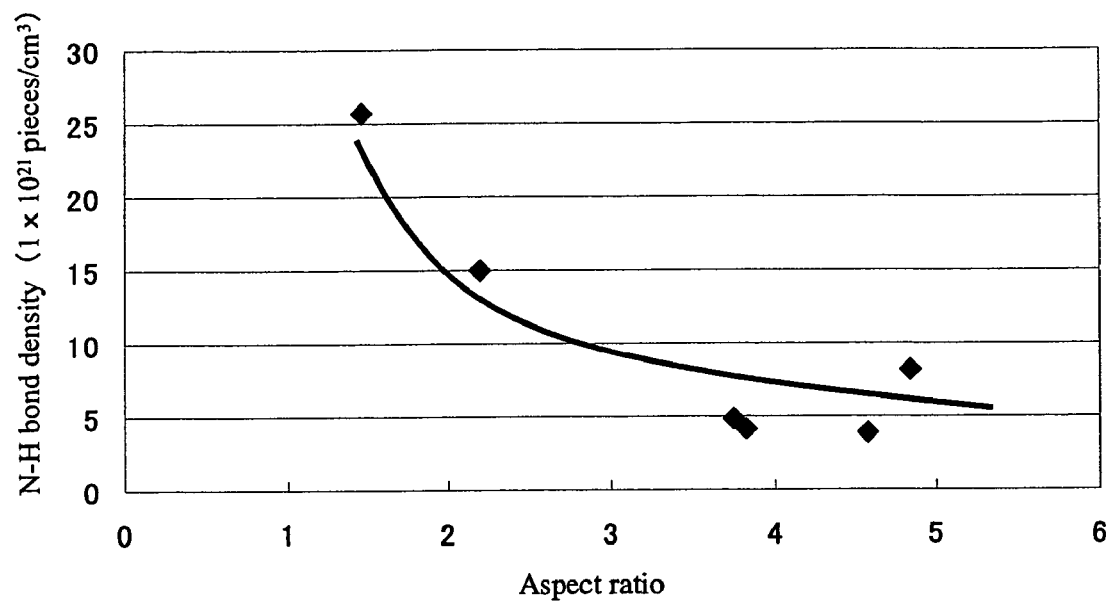
FIG. 2 shows the relationship between the aspect ratio of a step part between gates and the N—H bond density of a silicon nitride film for embedding a BPSG film in which voids do not occur in the step part between the gates according to Example 2 of the present invention.
Figure 3:
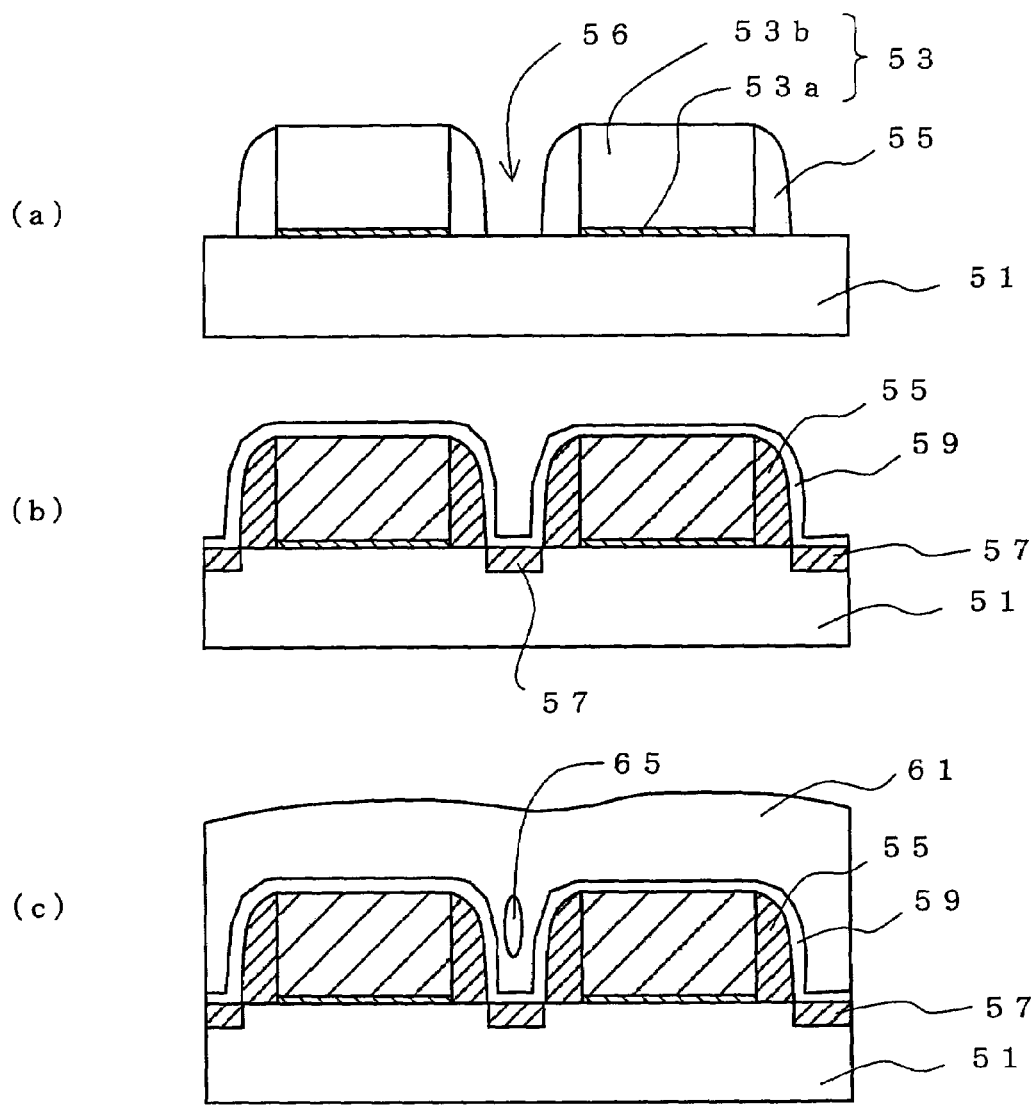
FIG. 3 is a sectional view showing a conventional method for forming an interlayer insulation film.
Figure 4:
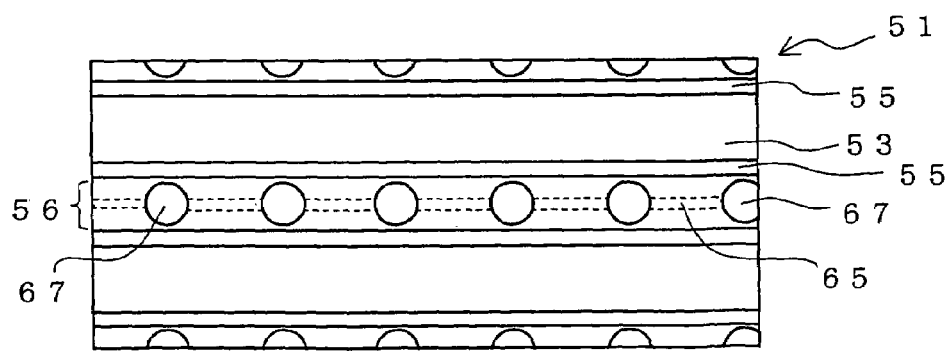
FIG. 4 is a plan view of a semiconductor substrate used for explaining problems when voids occur in a conventional method for forming an interlayer insulation film.

FIG. 2 shows the relationship between the aspect ratio of a step part between gates and the N—H bond density of a silicon nitride film for embedding a BPSG film in which voids do not occur in the step part between the gates. Herein, the term "aspect ratio" means a distance between the substrate and the upper surface of the gate pattern/a distance between sidewalls on the surface of the substrate. The distance between the sidewalls was determined by using a SEM.

The occurrence of voids can be suppressed in the step part by selecting film formation conditions of the silicon nitride film such that the relationship between the aspect ratio and the N—H bond density of the silicon nitride film is in a lower area of the characteristics curve in FIG. 2. The N—H bond density is measured by Fourier Transform Infrared spectroscope (FTS-40) manufactured by Bio-Rad Company.

Particularly, the graph of FIG. 2 was obtained in the following manner. First, samples in which depth of step parts between gates was within a range of 250 to 550 nm and a distance between gates was parameterized were prepared. SiN film was formed on each measurement sample in various conditions such that the N—H bond density of the film was within a range of 4.0 to $25.0 \times 10^{21}$ pieces/cm$^3$. After BPSG film was formed thereon, the BPSG film was annealed. Tungsten plugs were then formed by a known process, and The presence or absence of short-circuits of adjoining plugs was judged and evaluated. Then, from the judgment of the presence or absence of the short-circuits, the relationship between the aspect ratio and the N—H bond density of the silicon nitride film suppressing the occurrence of voids was sought.

As is apparent from the characteristics curve of FIG. 2, for example, when a space between the gates is 0.3 μm and the aspect ratio of the step part is 3 or more, the BPSG film in which voids do not occur can be formed by setting the N—H bond density of the silicon nitride film to $1.0 \times 10^{22}$ pieces/cm$^3$ or less.

What is claimed is:

1. A method for forming an interlayer insulation film, comprising:
   forming an etching stopper film of a silicon nitride film on an entire surface including a step part on a semiconductor substrate, the step part having an aspect ratio of $\geq 3$ and being formed between gates on the semiconductor substrate;
   forming an interlayer insulation film of an impurity-doped silicate film on the silicon nitride film; and
   performing reflow of the interlayer insulation film by a heat treatment, wherein the formation of the silicon nitride film is controlled such that the N—H bond density of the silicon nitride film is $1.0 \times 10^{22}$ pieces/cm$^3$ or less,
   wherein the silicon nitride film is formed by a plasma CVD method.

2. The method according to claim 1, wherein the heat treatment is conducted in a furnace at a temperature of 700° C. to 770° C. under an $N_2$ atmosphere.

* * * * *